(12) United States Patent
Tomari

(10) Patent No.: US 9,017,567 B2
(45) Date of Patent: *Apr. 28, 2015

(54) CHEMICAL TREATMENT METHOD

(75) Inventor: Yoshiaki Tomari, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/231,734

(22) Filed: Sep. 13, 2011

(65) Prior Publication Data

US 2012/0003839 A1 Jan. 5, 2012

Related U.S. Application Data

(60) Continuation of application No. 12/239,191, filed on Sep. 26, 2008, now Pat. No. 8,075,791, which is a division of application No. 10/737,766, filed on Dec. 18, 2003, now abandoned.

(30) Foreign Application Priority Data

Dec. 26, 2002 (JP) .................................. 2002-378697
Nov. 18, 2003 (JP) .................................. 2003-387880

(51) Int. Cl.

| | |
|---|---|
| *C23F 1/00* | (2006.01) |
| *H01L 21/67* | (2006.01) |
| *C25D 5/08* | (2006.01) |
| *C25D 21/10* | (2006.01) |
| *H01L 21/288* | (2006.01) |
| *H01L 21/306* | (2006.01) |
| *C25D 7/12* | (2006.01) |
| *C25D 17/00* | (2006.01) |
| *C25D 17/02* | (2006.01) |

(Continued)

(52) U.S. Cl.
CPC ............ *H01L 21/67086* (2013.01); *C25D 5/08* (2013.01); *C25D 21/10* (2013.01); *H01L 21/2885* (2013.01); *H01L 21/30608* (2013.01); *H01L 21/6708* (2013.01); *C25D 7/123* (2013.01); *C25D 17/001* (2013.01); *C25D 17/02* (2013.01); *C25D 17/08* (2013.01); *C25D 21/12* (2013.01)

(58) Field of Classification Search
USPC .................. 216/83, 90, 91, 99, 100, 92, 103; 438/678, 679, 754; 156/345, 51, 55, 156/345.51, 345.19, 345.2, 345.17, 345.18, 156/345.22
See application file for complete search history.

(56) References Cited

U.S. PATENT DOCUMENTS

| | | |
|---|---|---|
| 5,574,247 A | 11/1996 | Nishitani et al. |
| 5,884,009 A | 3/1999 | Okase et al. |

(Continued)

FOREIGN PATENT DOCUMENTS

| | | |
|---|---|---|
| JP | 2001-15454 A | 1/2001 |
| JP | 2001-24308 A | 1/2001 |

*Primary Examiner* — Lan Vinh
(74) *Attorney, Agent, or Firm* — Fitzpatrick, Cella, Harper & Scinto

(57) ABSTRACT

A chemical treatment apparatus and a method for performing a chemical treatment of a wafer, etc., by supplying a chemical via a cell. The apparatus includes a cylindrical inner cell and a cylindrical outer cell with open ends disposed at an outer circumference of the inner cell. The outer cell is axially movable to vary the width of a slit formed between a bottom end of the outer cell and a top surface of the substrate-holding means by the axial movement, thereby adjusting the discharge rate of the chemical and varying the pressure of the chemical.

4 Claims, 8 Drawing Sheets

(51) Int. Cl.
*C25D 17/08* (2006.01)
*C25D 21/12* (2006.01)

(56) References Cited

U.S. PATENT DOCUMENTS

| | | |
|---|---|---|
| 6,610,182 B2 | 8/2003 | Sakaki et al. |
| 6,632,335 B2 | 10/2003 | Matsuda et al. |
| 6,715,943 B2 * | 4/2004 | Nagamine ............ 396/611 |
| 6,755,954 B2 | 6/2004 | Mayer et al. |
| 6,773,571 B1 | 8/2004 | Mayer et al. |
| 6,793,769 B2 * | 9/2004 | Kajino et al. ............ 156/345.55 |
| 6,823,815 B2 | 11/2004 | Han et al. |
| 6,833,063 B2 | 12/2004 | Basol |
| 6,874,516 B2 | 4/2005 | Matsuno et al. |
| 7,171,973 B2 * | 2/2007 | Orii et al. ............ 134/148 |
| 8,075,791 B2 * | 12/2011 | Tomari ............ 216/83 |
| 2002/0008037 A1 | 1/2002 | Wilson et al. |
| 2002/0019204 A1 * | 2/2002 | Takahashi et al. ............ 451/286 |

* cited by examiner

CHEMICAL TREATMENT METHOD

CROSS-REFERENCE TO RELATED APPLICATIONS

This application is a continuation of application Ser. No. 12/239,191, filed Sep. 26, 2008, which is a division of application Ser. No. 10/737,766, filed Dec. 18, 2003, now abandoned. Both prior applications are incorporated herein by reference in their entirety.

BACKGROUND OF THE INVENTION

1. Field of the Invention

The present invention relates to a chemical treatment apparatus that is suitable for performing the deposition of a metal or treatment such as etching by supplying a chemical to a surface of a substrate such as a silicon wafer.

2. Related Background Art

Semiconductor devices in which high-density interconnections are formed by forming through holes, non-through holes, grooves, etc. on a substrate such as a silicon wafer have hitherto been manufactured. To that end, a process in which a surface of the substrate is subjected to a plating treatment and an etching treatment by use of a chemical is frequently adopted. For example, through holes, non-through holes and grooves having a prescribed shape are formed in a substrate by performing an etching treatment or a substrate in which holes and grooves are formed beforehand is filled with a metal by the electroplating treatment, whereby electrical interconnections are fabricated.

Three types of apparatuses have been used as chemical treatment apparatuses in the plating treatment and the etching treatment. These apparatuses are of (i) the vertical type in which with a substrate is vertically set, a chemical and a surface to be treated (hereinafter, referred to as "treating surface") of the substrate are brought into contact with each other; (ii) the face down type in which a treating surface of a substrate is brought into contact with a jet flow of a chemical with this surface facing downward; and (iii) the face up type in which a treating surface of a substrate is brought into contact with a jet flow of a chemical with this surface facing upward.

FIG. 6 is a schematic diagram of a conventional face up type electroplating apparatus. In FIG. 6, a silicon wafer 601 having a Cu seed film is disposed on a wafer-holding jig 602 with its treating surface facing upward. The silicon wafer 601 and wafer-holding jig 602 are installed in an outer cell 621 having the shape of an inverted cup, which is filled with a plating liquid 600.

An inner cell 611 is installed above the silicon wafer 601 within the outer cell 621, and an anode 613 having the shape of a grating board is attached to the bottom end portion of this inner cell 611. From gaps 612 of this anode 613 having the shape of a grating board, the fresh plating liquid 600 fed from an external liquid-feeding pump, which is not shown in the figure, is discharged toward the treating surface of the silicon wafer 601. The plating liquid 600 is recovered from a chemical discharge port 622 provided in the upper part of the outer cell 621 into an external receiving tank, which is not shown in the figure. By applying a voltage to between the anode 613 having the shape of a grating board and the silicon wafer 601 having a seed film, it is possible to cause a metal to deposit on the seed film of the silicon wafer 601. At the outer circumferential portion of the silicon wafer 601, a chemical seal 603 is formed to prevent the plating liquid 600 from entering the wafer-holding jig 602.

Furthermore, in addition to the method that uses the above-described anode 613 having the shape of a grating board, Japanese Patent Application Laid-Open No. 2001-015454 describes the use of a partition board that has a large number of discharge pores having a pore diameter of 0.1 mm to 1 mm. Also, Japanese Patent Application Laid-Open No. 2001-024308 (Patent Document 2) describes the use of a board in which a large number of through holes having an inside diameter of 3 mm are formed in a 30 mm thick plate body. By adopting such configurations, it is possible to prevent the drop of a chemical from the inside of a fine tube due to surface tension when the supply of a plating liquid is stopped.

Other than the face up type, a vertical type chemical treatment apparatus is frequently used in the electroless plating treatment, etching treatment, etc. FIG. 7 is a schematic diagram of a vertical type chemical treatment apparatus. In FIG. 7, a wafer 701 attached to a wafer-holding jig 702 is vertically immersed in a treatment vessel, with its treating surface facing toward a chemical delivery nozzle 714. In FIG. 7, the silicon wafer 701 attached to the wafer-holding jig 702 is vertically immersed in the treatment vessel 721 in such a manner that the treating surface faces toward the chemical delivery nozzle 714. An electroless plating liquid or an etching liquid 700 discharged from a nozzle 714 is fed from an overflow vessel 706 to a liquid feeding pump 723, is circulated and is used again in the chemical treatment.

Recent years have seen increasingly high requirements for high-density design of semiconductor devices that use a silicon wafer as a substrate. When a substrate in which through holes, non-through holes, grooves, etc., are formed is subjected to an etching treatment and a plating treatment using a chemical, it is necessary to rapidly replenish the chemical, because it is used up by reactions that occur in the holes and grooves. By rapidly replacing the chemical with a fresh one, it is possible to constantly keep the concentrations of effective components of the chemical at constant levels, and hence, it is possible to realize uniform, high-grade, high-speed treatment.

However, the recovery of the concentrations of the effective components that have been consumed at reaction interfaces is rate controlled by the diffusion rates of the effective components in the solution. For this reason, it is necessary to increase the diffusion rates of the effective components to the highest possible levels. However, in the vertical type shown in FIG. 7, a chemical does not diffuse uniformly due to the effect of gravity and in particular, the replacement of the chemical at the bottoms of the grooves tends to become insufficient. Furthermore, the distribution of the liquid flow on the surface of a substrate also tends to become nonuniform. For this reason, a variation in the film thickness distribution of a coating film and a variation in the etched amount occur.

In contrast, in the case of the face up method shown in FIG. 6, the structure of the apparatus enables a chemical to diffuse easily in comparison with the vertical type, variations due to gravity do not occur, and the possibility that a gas generated on the treating surface stagnates is weak. Furthermore, by installing a device for stirring a plating liquid in the interior of the outer cell, it becomes possible to diffuse the chemical more rapidly, thereby making the distribution of the chemical uniform. However, in the case of through holes, non-through holes and grooves, which have an inside diameter and a minimum diameter that are as small as not more than 200 μm and a high aspect ratio of not less than 1:3, it takes a very long time before the consumed chemical in the through holes, non-through holes and grooves diffuses to the outside. Furthermore, it is conceivable that in some cases the exhausted chemical does not completely diffuse and stagnates in the interior of the through holes, non-through holes and grooves, causing nonuniform treatment and prolongs the treatment time. Also, there is a possibility that the chemical itself does not sufficiently flow into the through holes, non-through holes and grooves, resulting in an insufficient treatment.

SUMMARY OF THE INVENTION

The present invention has been accomplished to resolve these problems.

It is, therefore, an object of the present invention to provide a chemical treatment apparatus which keeps a variation in the chemical concentration distribution at a minimum level by positively promoting the supply of a chemical to the interior or bottoms of through holes, non-through holes and grooves having small inside diameters and minimum diameters and a high aspect ratio and the concentration recovery of the chemical without using a complex mechanism, and which permits a high-grade chemical treatment with a minimum consumption of the chemical.

It is another object of the invention to substantially reduce the amount of a chemical used because it is unnecessary to install a complex pressure control mechanism and also because it is possible to efficiently employ the chemical used.

It is still another object of the invention to ensure that the uniformity of the chemical treatment is improved, because the distribution of the liquid flow on a treating surface can be reduced by using a flow regulating porous plate, and that the yield of products after treatment is improved.

It is yet another object of the invention to ensure that the amount of the chemical required by one apparatus is also reduced.

To achieve the above-described objects, as a chemical treatment apparatus of the invention there is provided a chemical treatment apparatus which supplies, in the interior of a vessel, a chemical to a substrate held by a substrate-holding means via a cell and thereby performs a treatment by bringing the chemical into contact with a treating surface of the substrate, wherein the cell comprises a cylindrical inner cell and a cylindrical outer cell with open ends attached to an outer side of the inner cell. The outer cell is axially movable and arbitrarily varies the width of a slit formed between a bottom end of the outer cell and a top surface of the substrate-holding means by this axial movement, thereby adjusting the discharged amount of the chemical.

The above and other objects, features and advantages of the invention will become more apparent from the following detailed description taken in conjunction with the accompany drawings.

BRIEF DESCRIPTION OF THE DRAWINGS

FIGS. 3-1, 3-2 and 3-3 are schematic sectional views showing the process of the electroplating apparatus of Example 1;

DESCRIPTION OF THE PREFERRED EXAMPLES

Figure 1:
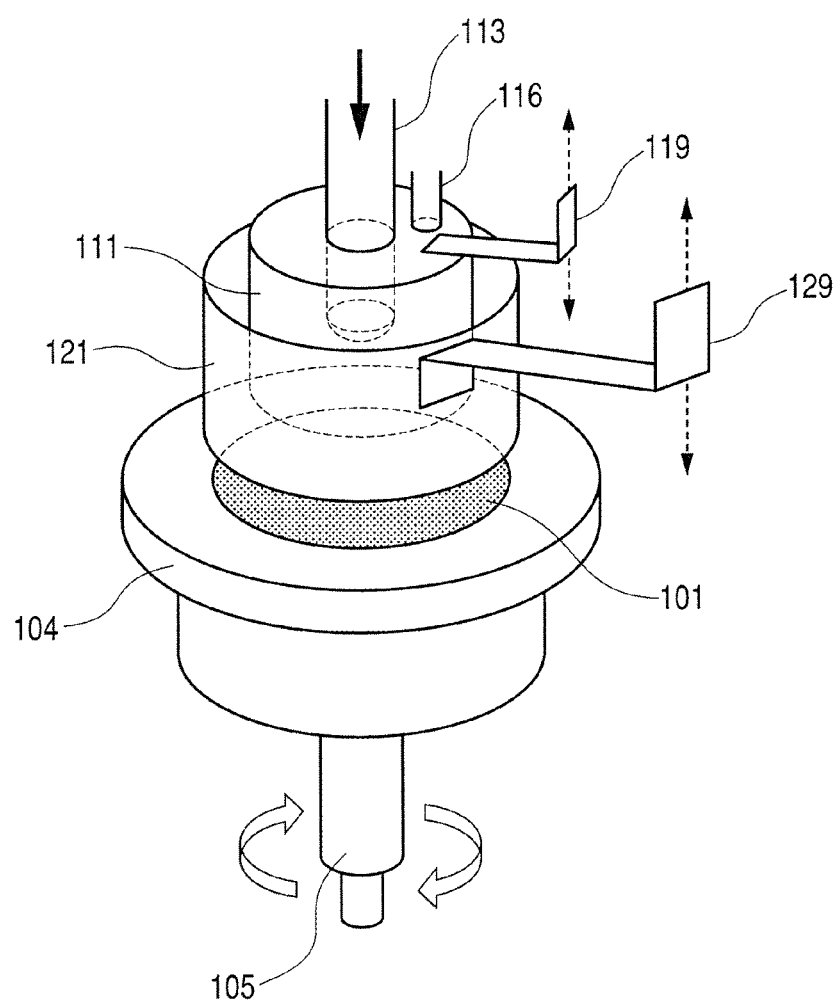
FIG. 1 is a schematic perspective view of an electroplating apparatus of Example 1.

Examples of the present invention will be described in detail by referring to the drawings.

Example 1

Figure 2:
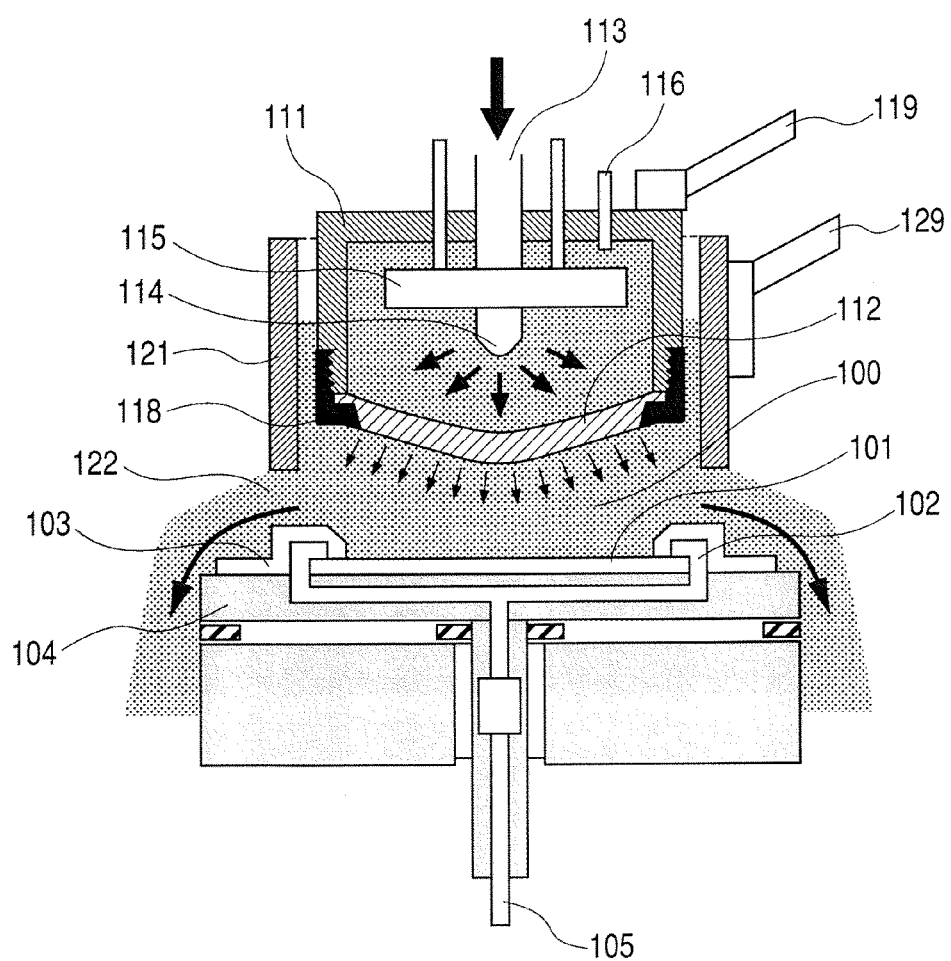
FIG. 2 is a schematic sectional view of the electroplating apparatus of Example 1.

FIG. 1 shows a schematic perspective view of an electroplating apparatus in accordance with Example 1 of the invention. FIG. 2 is a sectional view of the apparatus of FIG. 1. In the figures, the numeral 101 denotes a substrate to be plated, which is a silicon wafer. In the surface of the silicon wafer, through holes, non-through holes and grooves are formed so that the wafer can function as a semiconductor device. The minimum diameter of the through holes, non-through holes or grooves is 2 μm to 200 μm and their aspect ratio is 1:3 to 1:20. If the minimum diameter is less than 2 μm and the aspect ratio is greater than 1:20, it becomes difficult to feed the plating liquid itself into the interior of the holes and grooves. If the minimum diameter is greater than 200 μm and the aspect ratio is less than 1:3, the plating liquid diffuses sufficiently in a natural state. Incidentally, in the case of long holes and long grooves, the aspect ratio used here is an aspect ratio that is defined as a ratio of a groove depth to a minimum width. In a portion of the surface of the silicon wafer 101 that is to be subjected to a plating treatment, a seed layer for the plating is formed beforehand by Cu, etc. Incidentally, other than a silicon wafer, it is possible to use metal and glass as the substrate. However, when the substrate is an electrical conductor, portions not to be plated may be masked with a nonconductor, if necessary. The silicon wafer 101 is held on a wafer-holding jig 102 thereby, with the seed layer facing upward. An electrical power is supplied to the silicon wafer 101 via the wafer-holding jig 102. The outer circumferential portion of the silicon wafer 101 is sealed by a chemical seal 103, whereby a plating liquid 100 is prevented from entering a power supply contact between the silicon wafer 101 and the wafer-holding jig 102. Furthermore, the chemical seal 103 also prevents the etching liquid 100 from flowing behind. The wafer-holding jig 102 is attached to a rotary stand 104. The rotary stand 104 is connected to a rotary shaft 105 and is horizontally rotated and driven by a gear and a motor (not shown) that are connected to the rotary shaft 105.

An inner cell 111 having the shape of an inverted cup is installed above the silicon wafer 101 and the wafer-holding jig 102. A flow regulating porous plate 112 is provided at the bottom end of the inner cell 112. By using the flow regulating porous plate 112, it is possible to produce a liquid flow that is uniform over the entire treating surface of the silicon wafer 101, and it is also possible to perform a uniform plating treatment of the entire treating surface of the silicon wafer 101. A chemical transfer tube 113 passes through the center of the top surface of the inner cell 111 and a plurality of delivery ports 114 are provided at the bottom end of the chemical transfer tube 113. Because the plating liquid 100 is delivered from the delivery ports 114, the interior of the inner cell 111 is constantly filled with the plating liquid during the plating treatment. Because the supply of the plating liquid 100 from an external transfer pump is continued even after the inner cell 111 is filled with the plating liquid 100, the pressure in the interior of the inner cell 111 rises and the plating liquid 100 spouts from the flow regulating porous plate 112 attached to the bottom end of the inner cell 111. In this manner, by using the flow regulating porous plate 112 as delivery ports, which deliver the plating liquid 100 from the inner cell 111, it is possible to produce a liquid flow that is uniform over the entire effective area.

The bottom end of the inner cell 111 is provided with a thread groove, and an opening-regulating ring 118 is installed by use of the thread groove. The flow regulating porous plate 112 is attached to the inner cell 111 by use of the opening-regulating ring 118. Because the opening-regulating ring 118 is detachably installed for the flow regulating porous plate 112, simply replacing the opening-regulating ring 118 can easily perform the treatment of wafers of different diameters, so that the time for rescheduling is shortened.

Within the inner cell 111, an anode 115 through which the chemical transfer tube 113 pierces is provided and connected to an external power supply, which is not shown in the figure. A vent valve 116 is provided on the top surface of the inner cell 111 so that it is possible to remove a gas that has stagnated in the inner cell 111 as needed. Incidentally, in a case where electrolytic copper plating is performed, an anode made of soluble phosphorus-containing copper is usually used. However, it is also possible to make a selection from various insoluble electrode materials (for example, platinum) or various soluble electrode materials (for example, nickel) depending on the kind of the bath of the plating liquid is used. Also, with respect to the shape of the electrode, it is possible to select freely from various shapes ranging from a plate to a mesh.

The flow regulating porous plate 112 has a convex shape, such as a dome, so as to approach the silicon wafer 101 by protruding more at its central portion than at its peripheral portion. By providing such a dome shape, it is possible to perform the plating treatment even more uniformly over the entire treating surface of the silicon wafer 101. Furthermore, because a smooth discharge is possible from a slit in an outer circumferential portion between the bottom end of an outer cell 121, which will be described later, and the top surface of the chemical seal 103, no turbulent flow is formed on the surface of the silicon wafer 101. Therefore, it is possible to further improve the uniformity of the plating of the entire treating surface of the silicon wafer 101. In addition, during the plating treatment, a reaction gas does not stagnate on the bottom surface of the flow regulating porous plate 112 and is rapidly discharged upward from the gap between the inner cell 111 and the outer cell 121 due to the inclination of the dome-shaped surface. For this reason, it is unnecessary to install a complex mechanism, such as a rotary mechanism, to prevent the bubbles from adhering, and it is possible to design a compact apparatus.

Incidentally, the plate thickness of the flow regulating porous plate 112 is preferably 5 mm to 10 mm and the passages of the flow regulating porous plate 112 have an average pore diameter distribution having a center value within the range of preferably 5 $\mu$m to 200 $\mu$m, more preferably 10 $\mu$m to 150 $\mu$m. As the material for the flow regulating porous plate 112, any materials can be used without special limitations so long as they have chemical resistance. Although the flow regulating porous plate 112 has the shape of a dome as described above, it is preferable to set the distance from its center to the treating surface within the range of 2% to 30% with respect to the effective diameter of the flow regulating porous plate 112. If the above value is less than 2%, the likelihood that bubbles that adhere to the bottom surface of the flow regulating porous plate 112 cannot be discharged and will remain increases. If, however, the above value is greater than 30%, the difference in the distance to the treating surface increases in the treating surface plane, reducing the planting uniformity.

Furthermore, since the flow regulating porous plate 112 is used, the plating liquid 100 that fills the interior of the inner cell 111 will not drop naturally through the flow regulating porous plate 112 unless the liquid is fed from the external liquid feeding pump into the inner cell 111. As a result, it becomes unnecessary to perform a complex valve control during the replacement of the silicon wafer 101 after completing every plating treatment. Incidentally, a filter unit or a heating unit may be provided in the circulation system.

The cylindrical outer cell 121 is provided further outside of the inner cell 111. The outer cell 121 is arranged such that it is separated by a prescribed gap from the inner cell 111. The plating liquid 100 is delivered from the delivery ports 114 and fills the interior of the inner cell 111 and the interior of the outer cell 121. The inner cell 111 is vertically driven by a support arm 119. A support arm 129 vertically drives the outer cell 121. By vertically moving the outer cell 121, it is possible to freely vary the width of the slit 122 between the bottom end of the outer cell 121 and the top surface of the chemical seal 103. By arbitrarily varying the width of the slit 122, it is possible to control the discharge rate of the plating liquid 100 from the interior of the outer cell 121. The plating liquid 100 discharged from the slit 122 is recovered into an external receiving tank that is not shown, again transferred into the inner cell 111 and reused.

Next, the method of plating by the electroplating apparatus shown in FIGS. 1 and 2 will be described. First, the silicon wafer 101 is held by the wafer-holding jig 102. The plating liquid 100 is supplied via the chemical transfer tube 113 by use of a pump that is not shown and the plating liquid 100 is delivered from the delivery port 114. The delivered plating liquid 100 first fills the inner cell 111, and when the pressure in the interior of the inner cell 111 exceeds a prescribed value by the supply of the plating liquid 100, the plating liquid 100 flows to the outside through the flow regulating porous plate 112, which forms the bottom surface of the inner cell 111. At this time, the slit 122 formed by the bottom end of the outer cell 121 and the top end of the chemical seal 103 is closed and the plating liquid 100 that has flown to the outside is collected in the interior of the outer cell 121. When the volume of the plating liquid 100 in the interior of the outer cell 121 has reached a specific value, the plating treatment is started by applying a voltage to the anode 113 and the wafer-holding jig 102 using an external electrode, which is not shown. The voltage is applied to the seed layer of the silicon wafer 100 via the wafer-holding jig 102 and the plating growth begins. At the same time, the wafer-holding jig 102 starts to rotate.

Figures 1, 3:
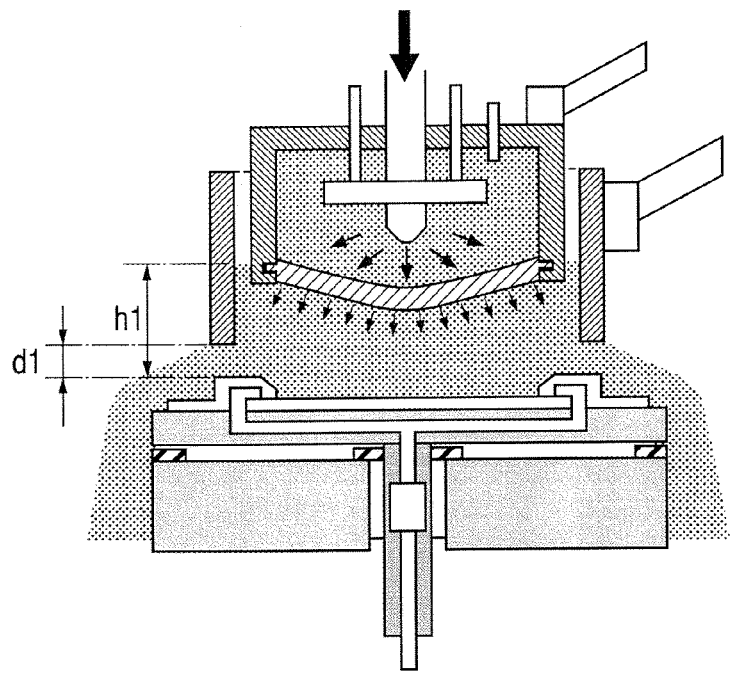
Figures 2, 3:
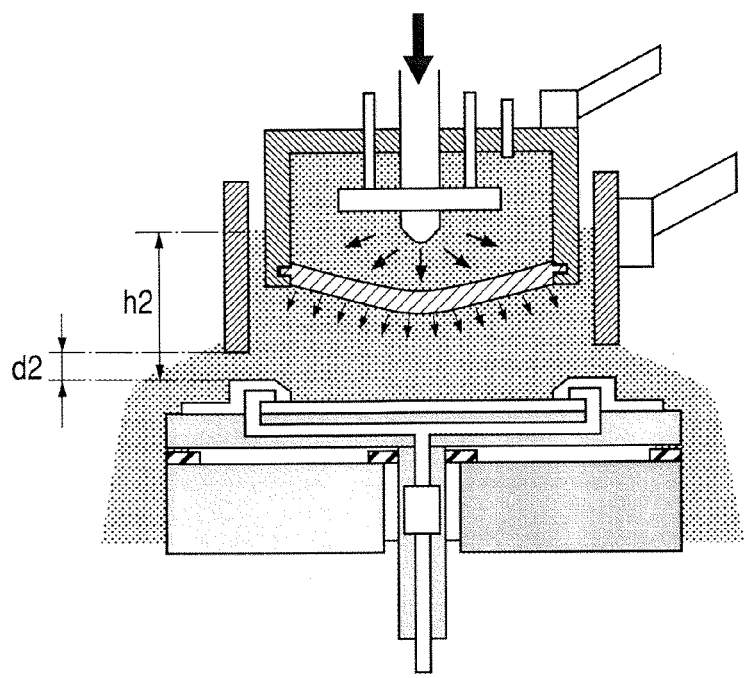
Figure 3:
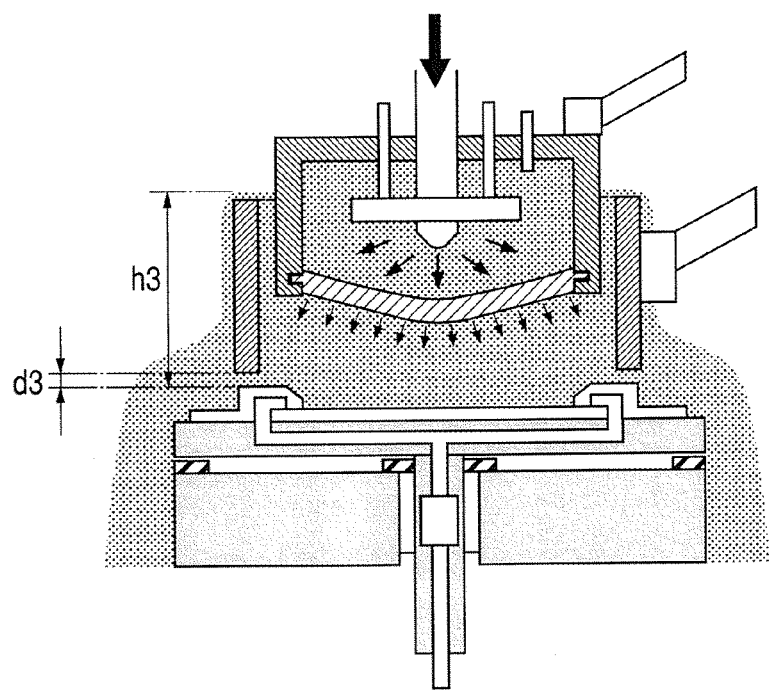

The width of the slit 122 formed by the bottom end of the outer cell 121 and the top end of the chemical seal 103 is set so as to change intermittently. FIGS. 3-1, 3-2 and 3-3 are perspective views to explain the action of changing the width of the slit 122. In FIGS. 3-1, 3-2 and 3-3, each one of the reference characters d1, d2 and d3 denotes the width of the slit 122 formed by the bottom end of the outer cell 121 and the top end of the chemical seal 103, and the slit 122 is formed with a width that is uniform along the full circumference of the bottom end of the outer cell 121. Each one of the reference characters h1, h2 and h3 denotes the height of the plating liquid in the space formed by the outer wall of the inner cell 111 and the inner wall of the outer cell 121, and the top surface of the chemical seal 103 serves as a reference point.

In FIG. 3-1, the slit width d1 is set so that the height h1 of the liquid surface becomes higher than the bottom end of the inner cell 111. In FIG. 3-2, d2 is set so that the height h2 of the liquid surface assumes a position near the center of the side of the inner cell 111. In FIG. 3-3, the slit width d3 is set so that the height h3 of the liquid surface assumes a position that is higher than the top end of the outer cell 121, and the plating liquid is also discharged in a small amount from the upper part of the outer cell 121. The speed at which the plating liquid passes through this slit increases in the order of FIG. 3-1, FIG. 3-2 and FIG. 3-3. The pressure of the plating liquid decreases in the order of FIG. 3-1, FIG. 3-2 and FIG. 3-3.

While the silicon wafer 101 is being subjected to the plating treatment by delivering the plating liquid 100 from the delivery port 114, the width of the slit 122 is repeatedly varied at prescribed time intervals in the order: d1, d2 and d3, and again d1, d2 and d3. This control of the width of the slit 122 is carried out by connecting the support arm 129 of the outer cell 121 to an electric slider that is not shown. Incidentally, for the above-described slit width d1, d2, d3, by moving the outer cell 121 using the support arm 129, it is possible to easily change set values depending on the circulation flow rate of the plating liquid 100 and various sizes of the outer cell 121 and inner cell 111, which are to be used. The changing of the slit width is not limited to the three steps of d1, d2 and d3, and the slit width may be set at two steps, or four or more steps.

Because the amount of the variation in the liquid level per unit time changes by varying the width of the slit 122 at prescribed time intervals, the pressure of the plating liquid 100 near the silicon wafer 101 changes instantaneously. In particular, when the width of the slit 122 changes from d3 to d1, the liquid surface height changes from h3 to h1 and, therefore, the pressure of the plating liquid 100 is reduced. Because the pressure of the plating liquid 100, which is in contact with grooves and openings in a constant pressurized state, decreases abruptly, the exhausted plating liquid inside the through holes, non-through holes and grooves is introduced to the outside and is rapidly replaced with a fresh plating liquid. Incidentally, by rotating the rotary stand 104 to which the substrate-holding jig 102 is attached, it is possible to easily discharge the exhausted plating liquid 100 from the slit 122. As a result of this, the uniformity of the plating liquid is further improved. Furthermore, not only the replacement of the plating liquid in the through holes, non-through holes and grooves, but also the change of the width of the slit 122 from d3 to d1 at the start of the plating treatment enables the plating liquid inside the through holes, non-through holes and grooves to be positively supplied to the interior of the through holes, non-through holes and grooves.

By performing the plating treatment in this manner, it is possible to abruptly increase or decrease the pressure of the plating liquid that is in contact with the through holes, non-through holes and grooves simply by slightly changing the degree by which the slit 122 is open. As a result, even in the case of a silicon wafer provided with through holes, non-through holes and grooves having small inside diameters and minimum diameters and having a high aspect ratio, which make uniform plating liquid difficult in a conventional apparatus, it becomes possible to rapidly replace the exhausted plating liquid with a fresh plating liquid. Therefore, it is possible to keep the concentrations of components in reaction sites at constant levels, making it possible to perform high-speed, uniform plating.

Furthermore, because the plating liquid 100 circulates rapidly from the inner cell 111 to the silicon wafer 101, from the silicon wafer 101 to the slit 122, and again from the slit 122 to the inner cell 111, it is possible to reduce the required amount of the plating liquid, downsize the inner cell 111 and make the entire apparatus more compact. Also, it becomes possible to fill and discharge the plating liquid in a short period of time and to reduce the tact time of the plating liquid. Furthermore, because the turbulent flow due to the delivery of the plating liquid does not occur on the treating surface, it is possible to reduce the distance from the bottom surface of the flow regulating porous plate more than in a conventional treatment apparatus. Also, because a complex apparatus and complex control are unnecessary, it is possible to miniaturize the apparatus and accessory devices, which is very economical.

Experimental Example 1

The silicon wafer 101 was subjected to a Cu plating treatment using the above-described electroplating apparatus shown in FIGS. 1 and 2. The silicon wafer 101 used was 4 inches in diameter and 625 µm in thickness. A Cu seed film was formed on the surface of the silicon wafer 101. A protective resist pattern was formed on a portion not to be plated via the photolithography process. The openings of the protective pattern were a rectangle of 50 µm×15 µm, a concavity of 255 µm in depth was formed therein, and a Cu seed film was exposed on the bottom of the concavity. The aspect ratio was 1:15. The silicon wafer was covered by a chemical seal to a place 5 mm from the outer circumference.

The inner cell 111, which is 100 mm in outside diameter, 83 mm in inside diameter and 65 mm in height, has the shape of a cylinder whose bottom end alone is opened. The inner cell 111 is fixed to the support arm 119, which is freely driven and controlled in a vertical direction. The outer cell 121, which has a 130 mm outside diameter, 114 mm inside diameter and a 67 mm height, has the shape of a cylinder whose two ends are opened. The outer cell 121 is fixed to the support arm 129, which is freely driven in a vertical direction and is controlled so that its central axis coincides with that of the inner cell.

The electric slider used here is CPL42T2 made by Oriental Motor, which is provided with a 5-phase stepping motor. The outer cell was vertically moved at a speed of 15 mm/second by use of this electric slider. A similar electric slider was also connected to the inner cell support arm 119 and controlled to allow the inner cell 111 to be disposed at a prescribed position. The circulation flow rate of the plating liquid 100 was set at 25 (L/minute) and treatment was performed by repeatedly varying the slit width d at 10 second intervals so as to obtain d1=1.50 mm, d2=1.30 mm and d3=1.00 mm. As a result, as shown in FIGS. 3-1 to 3-3, a variation having liquid surface heights h1, h2, h3 was realized. At the same time, the rotary stand 104 connected to the wafer-holding jig 102 was rotated by the rotary shaft 105 at 350 rpm. At that time, the total volume of the chemical necessary for circulation and delivery was 8 L.

A porous plastic molded sheet made by Mitsubishi Plastic Industries, Ltd. (product name: Fildus) was used as the flow regulating porous plate 112. The flow regulating porous plate 112 is 7 mm in plate thickness, the average pore diameter distribution of the liquid passage has a center value at 100 µm, and the diameter of a plane of projection is 83 mm, which is the same as the inside diameter of the inner cell 111. The distance from the outer circumferential portion of the flow regulating porous plate 112 to the surface of the silicon wafer 113 provided with a Cu seed is 25 mm and the distance decreases gradually toward the center. The distance from the center to the surface of the silicon wafer 113 was set at 20 mm. The anode 115, through which the chemical transfer tube 113 is pierced, is made of a phosphorus-containing copper with a phosphorus content of 0.04 to 0.06% (manufactured by Sumitomo Metal Industries, Ltd.) and in the shape of a ring with an inside diameter of 80 mm, an outside diameter of 100 mm and a thickness of 12 mm.

The conditions for plating treatment are shown below.
Substrate and Seed Film Composition:

Silicon wafer (thickness 625 μm)/Ti (thickness 30 nm)/Cu (thickness 200 nm)
Plating Liquid Composition:
Copper sulfate pentahydrate 200 g/L, chlorine 60 mg/L, sulfuric acid 100 g/L, trace amounts of other additives
Opposite Electrode (Anode):
Phosphorus-containing copper electrode
Distance between electrodes (distance from top surface of seed film to bottom surface of opposite electrode): 70 mm
Inner Cell Size:
Outside diameter: 100 mm, inside diameter: 83 mm, height: 65 mm
Outer Cell Size:
Outside diameter: 130 mm, inside diameter: 114 mm, height: 67 mm
Outer cell driving speed: 15 mm/sec
Slit width: d1: 1.50 mm, d2: 1.30 mm, d3: 1.00 mm
Order of Slit Width Change:
Varied at interval of 10 seconds in the order of d1→d2→d3
Revolutions of the Rotary Stand:
200 revolutions/minute
Flow Regulating Porous Plate:
Plate thickness: 7 mm, central value of average pore diameter of liquid passages: 100 μm, dome shape in which center portion is 4 mm downward from peripheral portion, distance from center portion to surface of silicon wafer: 20 mm
Circulation rate of plating liquid: 25 L/minute
Required volume of chemical: 8 L
Resist pattern film thickness: 200 μm
Pattern Shape:
Rectangle of 50 μm×15 μm, Depth: 225 μm, Aspect ratio: 15
Plating time: 6 hours
Under these conditions, electrolytic copper plating was performed until the openings of the pattern were completely filled. The distribution of the thicknesses of the films deposited at that time was within ±2.0% and the film thickness distribution was excellent. Defects, such as voids, were not detected when the section of the pattern was observed.

Experimental Example 2

A Cu seed layer formed on the surface of the silicon wafer 101 was subjected to a Cu plating treatment using the above-described electroplating apparatus shown in FIGS. 1 and 2. The silicon wafer used was 6 inches in diameter and 625 μm in thickness.
The conditions for plating treatment are shown below.
Flow Regulating Porous Plate:
Plate thickness: 7 mm, central value of average pore diameter of liquid passages: 20 μm, dome shape in which center portion is 5 mm downward from peripheral portion, distance from center portion to surface of silicon wafer: 20 mm
Opposite Electrode (Anode):
Phosphorus-containing copper electrode
Distance between electrodes (distance from top surface of seed film to bottom surface of opposite electrode): 50 mm
Slit width: d1: 0.6 mm, d2: 0.5 mm, d3: 0.4 mm
Circulation rate of plating liquid: 2 L/minute
Pressure Inside Inner Cylinder of Inner Cell:
0.013 MPa
Current Density (Constant Current Control):
3 (A/dm□) (Applied voltage: 0.92 V).
Under these conditions, electrolytic copper plating was performed until the film thickness of the Cu plating film became 5 μm and the distribution of the thickness of the deposited film was measured, with the result that the variation in film thickness in an effective plane was within ±2.0% and the in-plane distribution was excellent.

Experimental Example 3

A Cu seed layer formed on a surface of a silicon wafer 101 was subjected to a Cu plating treatment using the above-described electroplating apparatus shown in FIGS. 1 and 2. The silicon wafer used was 6 inches in diameter and 625 μm in thickness.
The conditions for plating treatment are shown below. Conditions other than those shown below are the same as in Experimental Example 1.
Flow Regulating Porous Plate:
Plate thickness: 7 mm, central value of average pore diameter of liquid passages: 20 μm, dome shape in which center portion is 5 mm downward from peripheral portion, distance from center portion to surface of silicon wafer: 40 mm
Distance between electrodes (distance from top surface of seed film to bottom surface of opposite electrode): 80 mm
Slit width: d1: 1.0 mm, d2: 0.85 mm, d3: 0.7 mm
Circulation rate of plating liquid: 7.8 L/minute
Pressure Inside Inner Cylinder of Inner Cell:
0.035 MPa
Current Density (Constant Current Control):
3 (A/dm□) (Applied voltage: 0.92 V).
Under these conditions, energization was performed until the film thickness of the Cu plating film became 5 μm and the distribution of partial pressure of the deposited film was measured, with the result that the variation in film thickness in an effective plane was within ±2.0% and the in-plane distribution was excellent.

Experimental Example 4

Electroplating was performed by attaching a mesh electrode coated with platinum in place of the soluble anode 115 in the apparatus used in Example 1. At that time, energization was performed until the film thickness of the gold plating film became 5 μm and the film thickness distribution of the deposited film was measured, with the result that variation in film thickness in an effective plane was within ±2.0% and the in-plane distribution was excellent.

Example 2

Figure 4:
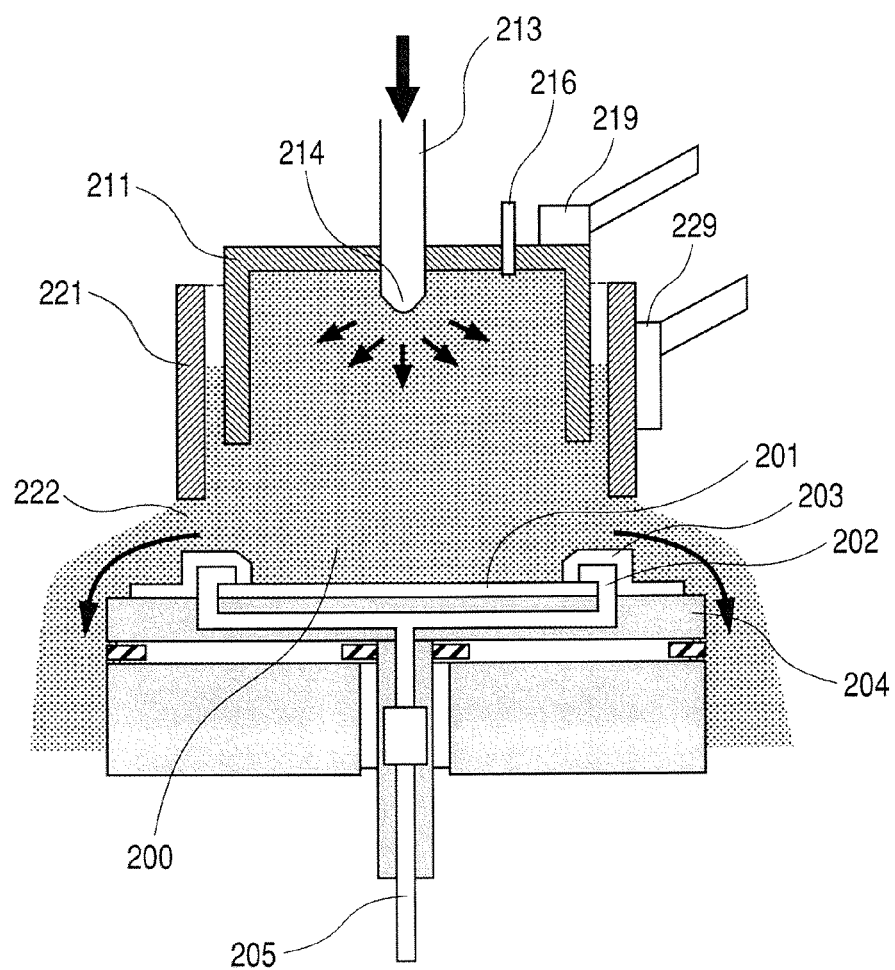
FIG. 4 is a schematic sectional view of an etching apparatus of Example 2.

FIG. 4 is a schematic perspective view of an etching apparatus in accordance with Example 1 of the invention. In the figure, numeral 201 denotes a silicon wafer as a substrate. Other than a silicon wafer, it is also possible to use a metal or a glass substrate. Portions of the surface of the silicon wafer 201 that are not subjected to the etching treatment are beforehand masked with a protective film, etc. While sealed by a chemical seal 203 provided in its outer circumferential portion, the silicon wafer 201 is mounted on a substrate-holding jig 202. The chemical seal 203 is provided in order to prevent an etching liquid 200 from flowing behind. The substrate-holding jig 202 is attached to a rotary stand 204. The rotary stand 204 is connected to a rotary shaft 205 and is horizontally rotated along with a rotary shaft 205, which is driven by the rotary motion of a gear and a motor (not shown).
An inner cell 211 having the shape of an inverted cup is installed above the silicon wafer 201 and the wafer-holding jig 202. A cylindrical outer cell 221 is provided further outside the inner cell 211. The outer cell 221 is arranged such that it is separated from the inner cell 211 by a prescribed gap. The bottom end of the inner cell 211 is spaced from the silicon wafer 201 and the top surface of the chemical seal 203 by a prescribed gap. The etching liquid fills the interior of the inner cell 211 and the space enclosed by the inner cell 211 and the outer cell 221. The inner cell 211 is vertically movable by a support arm 219 and the outer cell 221 is vertically movable by a support arm 229. By vertically moving the outer cell 221, a slit 222 is formed between the bottom end of the outer cell 221 and the silicon wafer 201 and the top end of the chemical seal 203, and by arbitrarily varying the width, the discharge volume of the etching liquid 200 is controlled. The etching liquid 200 discharged from the slit 222 is recovered into an external receiving tank, which is not shown, and is reused again as the etching liquid.

A delivery port 214 for delivering the etching liquid 200 is disposed above the silicon wafer 201 in the inner cell 211. The etching liquid 200 is supplied to the delivery port 214 via a transfer tube 213. Numeral 216 denotes a vent valve disposed on the top surface of the inner cell 211. By use of the valve 216 an unnecessary gas in the inner cell 211 is discharged to the outside.

The cylindrical outer cell 221, which is an essential feature of the present invention, is provided further outside the inner cell 211. The outer cell 221 is separated from the inner cell 211 by a prescribed gap. The etching liquid 200 is delivered from the delivery ports 214, which will be described later, and fills the interior of the inner cell 211 and the interior of the outer cell 221. The inner cell 211, which is vertically movable, is driven by the support arm 229. The outer cell 221, which is vertically movable, is driven by the support arm 129. By vertically moving the outer cell 221, it is possible to adjust the width of the slit 222 between the bottom end of the outer cell 221 and the top surface of the chemical seal 203. By arbitrarily varying the width of the slit 222, it is possible to control the discharge rate of the etching liquid 200 from the interior of the outer cell 221. The etching liquid 200 discharged from the slit 222 is recovered into an external receiving tank (not shown) and is transferred again into the inner cell 211 for reuse by means of an external liquid-feeding pump (not shown).

Experimental Example 5

By use of the etching apparatus shown in FIG. 4, anisotropic etching of a 4-inch silicon wafer (thickness: 200 µm) having the (1, 0, 0) orientation was subjected to anisotropic etching to form 2000 through holes of 50 µm in inner diameter. The chemical used was a 20% aqueous solution of tetramethylammonium hydroxide. By circulating this solution heated to 80° C., etching of a pattern with openings formed in the 4-inch silicon wafer (thickness: 200 µm) by the photoresist process was performed to form through holes. The aspect ratio was 1:4.

The conditions at that time are shown below.
Inner Cell Size:
  Outside diameter: 100 mm, inside diameter: 83 mm, height: 65 mm
Outer Cell Size:
  Outside diameter: 130 mm, inside diameter: 114 mm, height: 67 mm
  Outer cell driving speed: 10 mm/sec
  Slit width: d1: 1.50 mm, d2: 1.30 mm, d3: 1.00 mm
Order of Slit Width Change:
  Varied at interval of 10 seconds in the order of d1→d2→d3
Revolutions of the Rotary Stand:
  300 revolutions/minute
  Circulation rate of plating liquid: 25 L/minute
  Required volume of treatment chemical: 8 L Treatment time: 5 hours The shape of the through holes formed on the whole surface of the silicon wafer was uniform and there was no hole that did not penetrate the wafer.

Example 3

Figure 5:
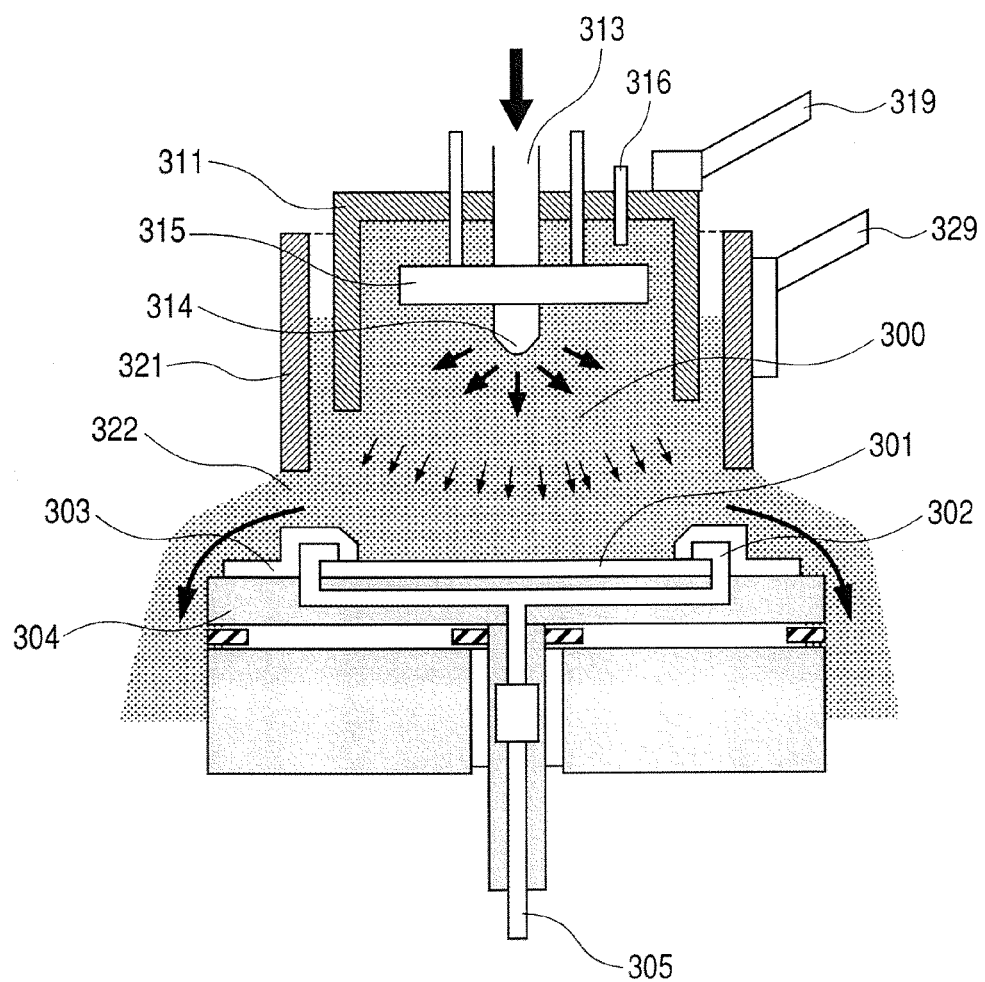
FIG. 5 is a schematic sectional view of an electroplating apparatus of Example 3.
Figure 6:
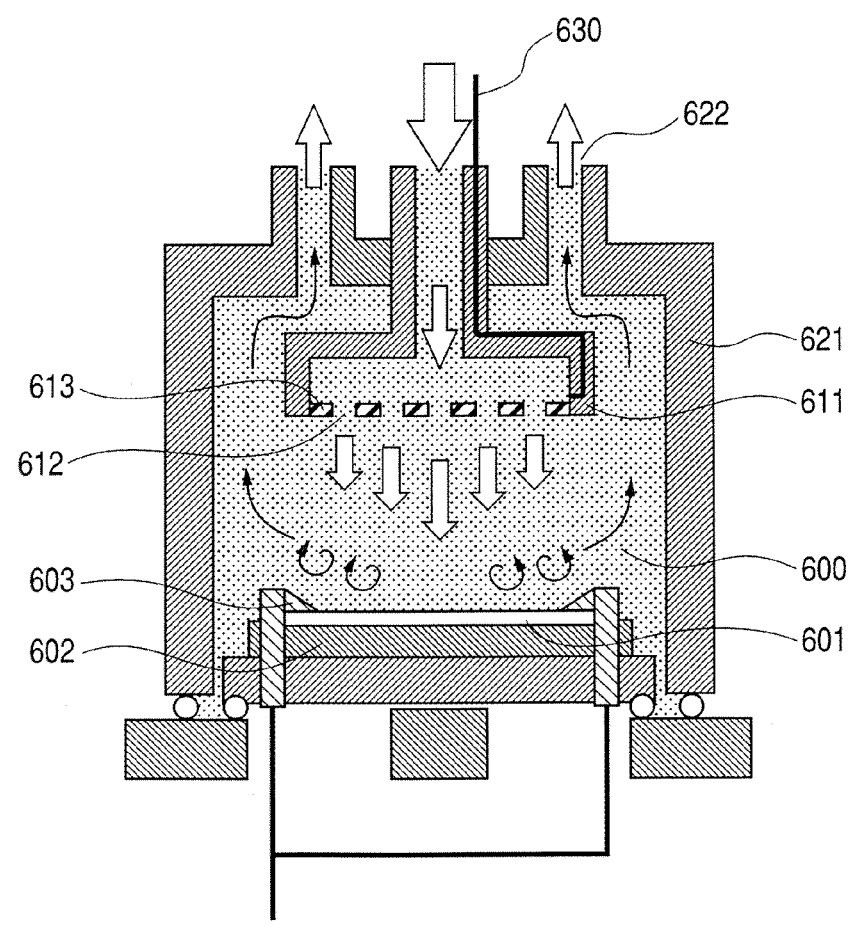
FIG. 6 is a schematic sectional view of a conventional electroplating apparatus.

FIG. 5 is a schematic sectional view of the electroplating apparatus shown in FIG. 1 when the flow regulating porous plate 122 is not mounted. In the figure, numeral 301 denotes a substrate to be plated, which is a silicon wafer. In the portion of the surface of the silicon wafer 301 that is to be subjected to the plating treatment, a seed layer for the plating is formed beforehand by Cu, etc. The silicon wafer 301 is held by means of a wafer-holding jig 302, with the seed layer facing upward. Power is supplied to the silicon wafer 301 via the wafer-holding jig 302. The outer circumferential portion of the silicon wafer 301 is sealed by a chemical seal 303, whereby the entry of a plating liquid 300 to a power supply contact between the silicon wafer 301 and the wafer-holding jig 302 is prevented. Furthermore, the chemical seal 303 also prevents the etching liquid 300 from flowing behind. The wafer-holding jig 302 is attached to a rotary stand 304. The rotary stand 304 is connected to a rotary shaft 305 and is horizontally rotated and driven by a gear and a motor (not shown) that are connected to the rotary shaft 305.

An inner cell 311 having the shape of an inverted cup is installed above the silicon wafer 301 and the wafer-holding jig 302. A chemical transfer tube 313 passes through the center of the top surface of the inner cell 311, and a plurality of delivery ports 314 are provided at the bottom end of the chemical transfer tube 313. Within the inner cell 311, an anode 315 through which the chemical transfer tube 313 pierces, is installed and connected to an external power supply that is not shown in the figure. A vent valve 316 is provided on the top surface of the inner cell 311, and it is possible to remove a gas that has stagnated in the inner cell 311 as needed.

A cylindrical outer cell 321 is provided further outside the inner cell 311. The outer cell 321 is arranged such that it is separated from the inner cell 311 by a prescribed gap. The plating liquid 300 is delivered from the delivery ports 314, which will be described later. A support arm 319 vertically drives the inner cell 311. A support arm 329 vertically drives the outer cell 321. By vertically moving the outer cell 321, it is possible to adjust the width of the slit 322 between the bottom end of the outer cell 321 and the top surface of the chemical seal 303. By arbitrarily varying the width of the slit 322, it is possible to control the discharge rate of the plating liquid 300 from the interior of the outer cell 321. The plating liquid 300 discharged from the slit 322 is recovered into an external receiving tank (not shown) and is transferred again into the inner cell 311 for reuse by means of an external liquid-feeding pump (not shown).

Experimental Example 6

By use of the electroplating apparatus shown in FIG. 5, an electrolytic Cu plating layer was formed on a silicon wafer 301 in which a protective resist pattern was formed on a Cu seed film by use of the photolithography process.

The silicon wafer 301 used was 6 inches in diameter and 625 µm in thickness. A Cu seed film was formed on the surface of the silicon wafer 301. The openings of the protective pattern were a rectangle of 50 µm×15 µm, a concavity of 300 µm in depth was formed therein, and a Cu seed film was exposed on the bottom of the concavity. The aspect ratio was 1:20. A Cu seed film was formed on the surface of the inner side of the concavity of the silicon wafer 301, and a protective resist pattern was formed using the photolithography process. The silicon wafer was covered by a chemical seal to a location 5 mm from the outer circumference. An inner cell 311, which was 160 mm in outside diameter, 144 mm in inside diameter and 98 mm in height, had a shape of a cylinder in which the bottom end alone is opened. An outer cell 321, which was 200 mm in outside diameter, 184 mm in inside diameter and 75 mm in height, had a shape of a cylinder where the top and bottom ends are both opened. The circulation flow rate of a plating liquid 317 was set at 30 L/minute and the number of revolutions of a rotary stand 304 was set at 300 rpm. With these settings, the plating treatment of the substrate was performed by varying the width of a slit 322 formed by the bottom end of the outer cell 321 and the top end of a chemical seal 303 at a time interval of 8 seconds so as to obtain d1=1.6 mm, d2=1.3 mm and d3=1.0 mm, thereby repeatedly causing changes in the liquid surface height h. The total volume of the plating liquid required in the apparatus, including the plating liquid in the tube, was 10 L.

The conditions at that time are shown below.
Substrate and Seed Film Composition:
  Silicon wafer/Ti (thickness 30 nm)/Cu (thickness 200 nm)
Plating Liquid Composition:
  Copper sulfate pentahydrate 200 g/L, chlorine 60 mg/L, sulfuric acid 100 g/L, trace amounts of other additives
Opposite Electrode:
  Phosphorus-containing copper electrode
  Distance between electrodes (distance from top surface of seed film to bottom surface of opposite electrode): 80 mm
Inner Cell Size:
  Outside diameter: 160 mm, inside diameter: 144 mm, height: 98 mm
Outer Cell Size:
  Outside diameter: 200 mm, inside diameter: 184 mm, height: 75 mm
  Outer cell driving speed: 10 mm/sec
  Slit width: d1: 1.6 mm, d2: 1.3 mm, d3: 1.0 mm
Order of Slit Width Change:
  Varied at interval of 15 seconds in the order of d1→d2→d3
Revolutions of the Rotary Stand:
  300 revolutions/minute
  Circulation rate of plating liquid: 30 L/minute
  Required volume of treatment chemical: 10 L
  Resist pattern film thickness: 200 μm
Pattern Shape:
  Rectangle of 50 μm×15 μm, Depth: 300 μm
  Aspect ratio: 20
  Plating time: 9 hours Under these conditions electrolytic copper plating was performed until the openings of the pattern were completely filled. The distribution of the thicknesses of the films deposited at that time was within ±2.5% and the film thickness distribution was excellent. Defects, such as voids, were not detected when the section of the pattern was observed.

Comparative Example 1

Figure 7:
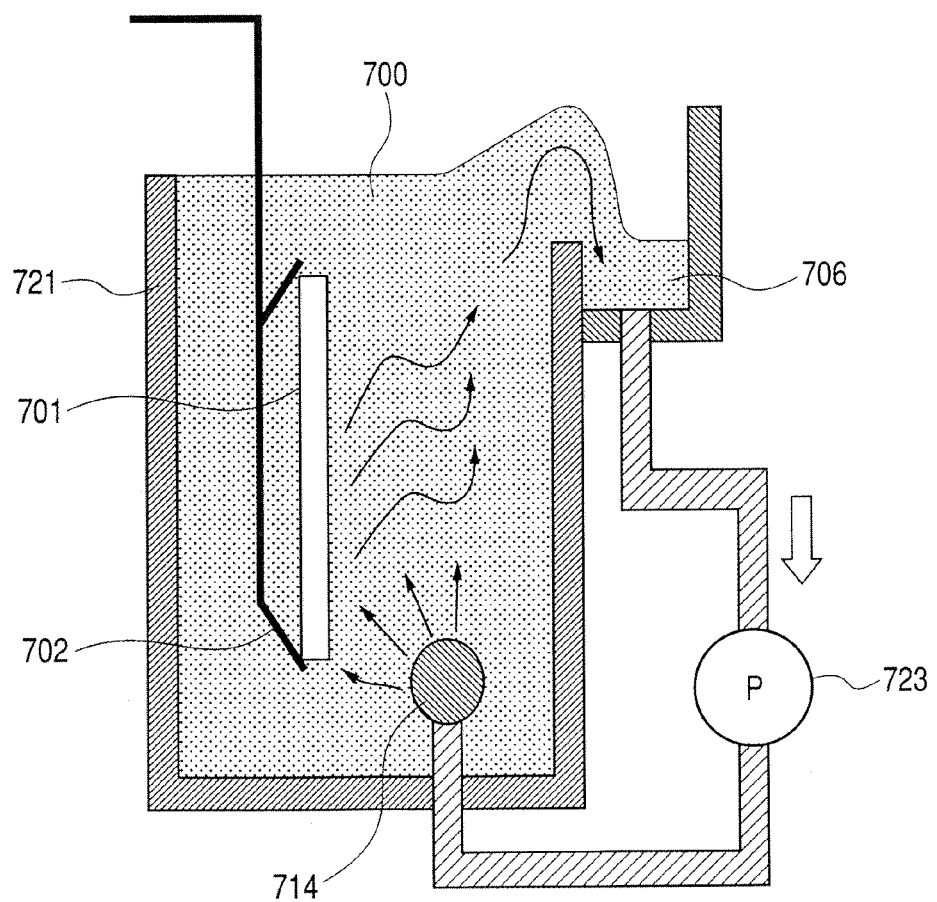
FIG. 7 is a schematic sectional view of a conventional electroplating apparatus.

As in Example 1, a soluble phosphorus-containing copper anode was attached to the vertical type plating apparatus shown in FIG. 7 opposite to a treating surface, and an electrolytic Cu plating film was grown on a silicon wafer provided with a Cu seed layer. The electrolytic Cu plating layer deposited by this apparatus had a cone-shaped deposition shape in which the film thickness decreases gradually from the peripheral portion of the wafer to the center portion thereof. When a 5 μm thick Cu plating film was deposited in the center portion of the wafer, the film thickness of the circumferential portion became 8 μm, and the in-pane uniformity was inferior to that of the apparatus of the present invention.

Comparative Example 2

By use of the vertical type etching apparatus shown in FIG. 7, anisotropic etching of a silicon wafer was performed for 7 hours in the same manner as in Example 3. The variation in the shape of through holes at that time was conspicuous, non-through portions were present in places, and the in-pane uniformity was inferior to that of the apparatus of the present invention.

Comparative Example 3

A soluble phosphorus-containing copper anode (an opposing electrode) was attached to the vertical type plating apparatus shown in FIG. 7 opposite to a treating surface, and a silicon wafer provided with a Cu seed layer in which a protective pattern similar to that used in Example 2 was formed was subjected to electrolytic copper plating for 10 hours. The wafer-holding jig and energizing jig used in this Comparative Example had the same energizing contact mechanism and chemical seal mechanism as used in Example 2.

When the pattern was filled by use of this apparatus, there were many portions unfilled with plated Cu. In locations where the pattern was filled with Cu, the film thickness increased by a factor of two or more. When a section was observed by cutting a silicon wafer after plating was completed, defects (voids) of various sizes were observed in all the patterns, and the results obtained were inferior to those obtained from the present apparatus in terms of uniformity and quality.

According to the chemical treatment apparatus of the invention, by providing a mechanism for performing chemical treatment while arbitrarily varying the width of a slit formed between the bottom end of the outer cell and the top surface of the substrate-holding means, it is possible to instantaneously vary the speed at which the chemical passes through the slit. As a result, the water pressure of the chemical in the outer cell, which is applied to the treating surface, can be instantaneously varied and, therefore, even in the case of through holes, non-through holes and grooves having small inside diameters and minimum diameters and having a high aspect ratio, it is possible to supply the chemical and also it is possible to replace the chemical in the grooves whose effective component concentrations have decreased with a fresh chemical, thereby enabling uniform high-grade treatment to be performed.

Also, by using the chemical treatment apparatus of the invention, it is unnecessary to install a complex pressure control mechanism, and it is possible to more efficiently utilize a chemical, thereby making it possible to substantially reduce its consumption.

Furthermore, by using a flow regulating porous plate, it is possible to reduce the distribution of the liquid flow on the treating surface and, therefore, the uniformity of chemical treatment is improved and the yield of products after the treatment is improved. Also, it is possible to reduce the amount of the chemical required by one apparatus.

What is claimed is:

1. A chemical treatment method using a chemical treating apparatus that performs a treatment by bringing an etching liquid or a plating liquid into contact with a treating surface of a substrate, the chemical treating apparatus comprising:

a substrate-holding means for holding a substrate;

a cylindrical inner cell disposed over the substrate-holding means;

a chemical supply means disposed inside of the cylindrical inner cell;

a cylindrical outer cell with open ends disposed at an outer circumference of the inner cell; and a slit which is formed between a bottom end of the outer cell and a top surface of the substrate-holding means for exhausting the etching liquid or the plating liquid, the method comprising the steps of:

supplying the etching liquid or the plating liquid from the cylindrical inner cell by the chemical supply means;

filling a space defined by the substrate-holding means as a bottom surface and the cylindrical outer cell as a side surface with the etching liquid or the plating liquid; and performing a chemical treatment of a surface of the substrate using the etching liquid or the plating liquid while axially moving the cylindrical outer cell to vary a width of the slit continuously, thereby changing an amount of variation in a liquid level per unit time and a pressure of the etching liquid or the plating liquid in the space.

2. The method according to claim 1, further comprising rotating the substrate-holding means while performing the chemical treatment.

3. A chemical treatment method using a chemical treating apparatus that performs a treatment by bringing an etching liquid or a plating liquid into contact with a treating surface of a substrate, the chemical treating apparatus comprising:

a substrate-holding means for holding a substrate;

a cylindrical inner cell disposed over the substrate-holding means;

a chemical supply means disposed inside of the cylindrical inner cell;

a cylindrical outer cell with open ends disposed at an outer circumference of the inner cell; and a slit which is formed between a bottom end of the outer cell and a top surface of the substrate-holding means for exhausting the etching liquid or the plating liquid, the method comprising the steps of:

supplying the etching liquid or the plating liquid from the cylindrical inner cell by the chemical supply means;

filling a space defined by the substrate-holding means as a bottom surface and the cylindrical outer cell as a side surface with the etching liquid or the plating liquid, thereby forming a state in which the treating surface of the substrate is dipped in the etching liquid or the plating liquid; and performing, while maintaining the state in which the treating surface of the substrate is dipped in the etching liquid or the plating liquid, a chemical treatment of the treating surface using the etching liquid or the plating liquid while axially moving the cylindrical outer cell to vary a width of the slit continuously, thereby changing an amount of variation in a liquid level per unit time and a pressure of the etching liquid or the plating liquid in the space.

4. The method according to claim 3, further comprising rotating the substrate-holding means while performing the chemical treatment.

* * * * *